United States Patent
Birnstock et al.

(10) Patent No.: US 7,375,461 B2
(45) Date of Patent: May 20, 2008

(54) ORGANIC, ELECTROLUMINESCENT DISPLAY AND METHOD FOR PRODUCING THE SAME

(75) Inventors: Jan Birnstock, Dresden (DE); Joerg Blaessing, Oberkochen (DE); Karsten Heuser, Erlangen (DE); Matthias Stoessel, Mannheim (DE); Georg Wittmann, Herzogenaurach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 309 days.

(21) Appl. No.: 10/483,144

(22) PCT Filed: Jul. 3, 2002

(86) PCT No.: PCT/DE02/02428

§ 371 (c)(1), (2), (4) Date: Jan. 7, 2004

(87) PCT Pub. No.: WO03/007377

PCT Pub. Date: Jan. 23, 2003

(65) Prior Publication Data

US 2004/0169464 A1 Sep. 2, 2004

(30) Foreign Application Priority Data

Jul. 11, 2001 (DE) ................. 101 33 685

(51) Int. Cl.
*H01L 27/00* (2006.01)
*H05B 33/00* (2006.01)

(52) U.S. Cl. ............ 313/504; 313/505; 313/506; 313/512; 445/23; 445/25

(58) Field of Classification Search ....... 313/501–512; 445/23–25; 427/58–66
See application file for complete search history.

(56) References Cited

U.S. PATENT DOCUMENTS 5,359,260 A    10/1994    Rawlings et al.

(Continued)

FOREIGN PATENT DOCUMENTS

DE    19918193 A1    4/1999

(Continued)

OTHER PUBLICATIONS

Tang, C.W. et al., "Organic electroluminescent diodes", Applied Physics Letters Vo. 51, No. 12, Sep. 21, 1987, pp. 913-915.

(Continued)

*Primary Examiner*—Ashok Patel
(74) *Attorney, Agent, or Firm*—Fish & Richardson P.C.

(57) ABSTRACT

The invention relates to a passive matrix-driven display based on electroluminescent polymers having a structured matrix of pixels and a structured second electrode with electrode connectors, having the following features: the functional polymers are delimited by windows of an insulating layer and contact a first electrode structured in the shape of strips and a second electrode, running parallel to the first electrode and also strip-shaped, which is in contact with electrode connectors; additional windows are disposed in the insulating layer and are positioned over the electrode connectors for the second electrode, or areas of the insulating layer are disposed between the electrode connectors; an encapsulation is provided that covers the insulating layer with the functional polymers and the second electrode, but leaves one end of each electrode connector exposed.

22 Claims, 8 Drawing Sheets

U.S. PATENT DOCUMENTS

| | | | |
|---|---|---|---|
| 5,701,055 A | 12/1997 | Nagayama et al. | |
| 5,773,931 A | 6/1998 | Shi et al. | |
| 6,037,712 A | 3/2000 | Codama et al. | |
| 6,069,443 A | 5/2000 | Jones et al. | |
| 6,140,766 A * | 10/2000 | Okada et al. | 313/506 |
| 6,191,764 B1 * | 2/2001 | Kono et al. | 345/76 |
| 6,249,084 B1 | 6/2001 | Yamana | |
| 6,582,888 B1 | 6/2003 | Herbst et al. | |
| 6,656,611 B2 | 12/2003 | Tai et al. | |
| 6,811,808 B2 * | 11/2004 | Ohshita et al. | 427/66 |
| 6,939,732 B2 | 9/2005 | Birnstock et al. | |
| 2001/0035393 A1 | 11/2001 | Lu et al. | |
| 2001/0035714 A1 | 11/2001 | Lu | |
| 2001/0054868 A1 * | 12/2001 | Okuyama et al. | 313/504 |

FOREIGN PATENT DOCUMENTS

| | | |
|---|---|---|
| EP | 0732868 | 9/1996 |
| EP | 0767599 A2 | 4/1997 |
| EP | 0892028 A2 | 1/1999 |
| EP | 0910128 A2 | 4/1999 |
| EP | 0951073 A2 | 10/1999 |
| EP | 0996314 | 4/2000 |
| EP | 1107335 A2 | 6/2001 |
| EP | 1168448 A2 | 1/2002 |
| JP | 09330792 | 12/1997 |
| JP | 11339958 A | 12/1999 |
| JP | 2000021567 A | 1/2000 |
| JP | 200294371 A | 10/2000 |
| WO | WO 01/39272 | 5/2001 |
| WO | WO 01/41229 | 6/2001 |

OTHER PUBLICATIONS

Nagayama, K. et al., "Micropatterning Method for the Cathode of the Organic Electroluminescent Device", Jpn. J. Appl. Phys. vol. 36, Part 2, No. 11B, L1555-L1557, Nov. 15, 1997.

Burroughs, J.H. et al., "Light-emitting diodes based on conjugated polymers", Nature vol. 347, Oct. 11, 1990, pp. 539-541.

U.S. Appl. No. 10/483,520, filed Jan. 9, 2004.

U.S. Appl. No. 10/483,520, Final Office Action mailed Mar. 6, 2007.

* cited by examiner

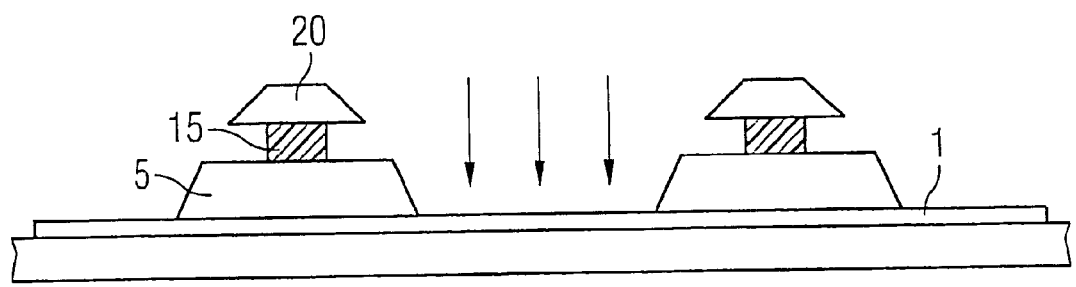
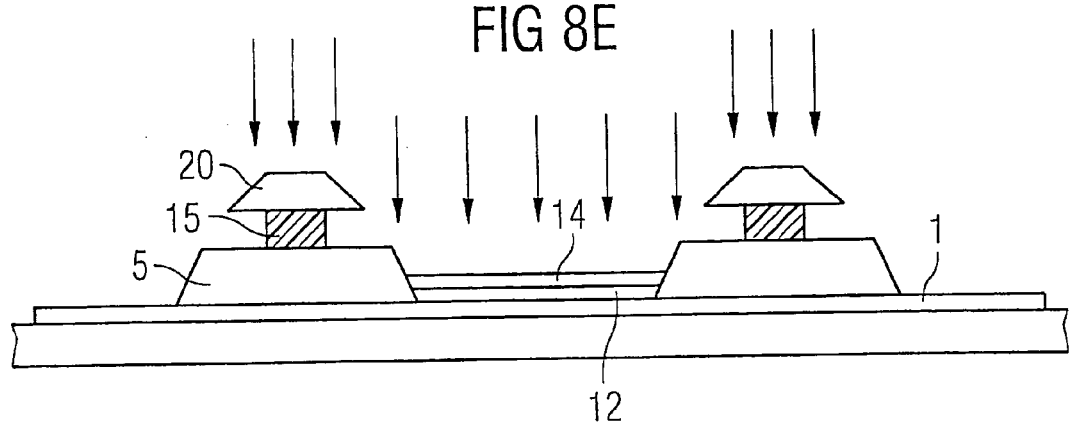
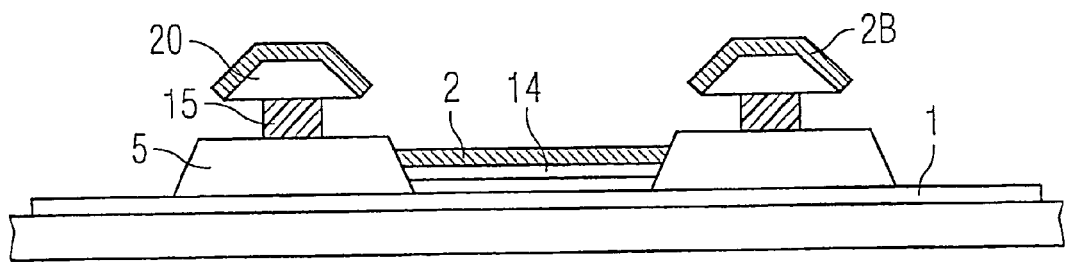

ORGANIC, ELECTROLUMINESCENT DISPLAY AND METHOD FOR PRODUCING THE SAME

BACKGROUND

The present application relates generally to organic electroluminescent display, and particularly relates to a passive matrix-driven display based on electroluminescent polymers having a structured matrix of pixels and a structured second electrode, as well as its production.

The graphic depiction of information is becoming increasingly important in our daily life. More and more ordinary items are being provided with display elements, which make it possible to immediately obtain the information needed on site. In addition to the conventional cathode ray tube (CRT), which provides high image resolution but is associated with the disadvantage of high weight and high power consumption, the technology of flat panel displays (FPDs) was developed for use in mobile electronic devices.

The mobility of the devices places high demands on the display to be used. The first requirement to be mentioned in this connection is low weight, which eliminates conventional CRTs from the outset. Minimal depth of construction is another essential criterion. In fact, in many devices a depth of construction of the display of less than one millimeter is required. Because of the limited capacity of conventional or rechargeable batteries in mobile devices, low power consumption of the displays is also necessary. Another criterion is good legibility, even when there is a large angle between the display surface and the viewer, as well as legibility under various ambient light conditions. The capacity to display multi-color or full-color information is also becoming more and more important. And, last but not least, the useful lifetime of the components is also an important pre-requisite for use in various devices. The relative importance of individual criteria for the displays varies depending on the application.

Several technologies have already been developed for some time in the market of flat panel displays, all of which cannot be discussed in detail here. So-called liquid crystal (LC) displays are overwhelmingly dominant. Aside from its cost-effective producibility, low electric power consumption, low weight and low space requirements, the LCD technology also has serious disadvantages. LC displays are not self-emitting and therefore can only be easily read or recognized under especially favorable ambient lighting conditions. In most cases, this creates the need for back-lighting which, however, increases the thickness of the flat panel display many times over. Furthermore, most of the electric power consumption is used for illumination, and higher voltage is needed to operate the light bulbs or fluorescent tubes. This is usually generated from the conventional or rechargeable batteries using "voltage-up converters." Another disadvantage is the highly limited viewing angle of simple LCDs and the lengthy switching times of individual pixels, which typically comprise several milliseconds and are also highly temperature-dependent. The delayed image development is extremely bothersome, especially when LCDs are used in means of transportation or in video applications.

In addition to LCDs, other flat display technologies, such as vacuum fluorescence displays or inorganic thin layer electroluminescence displays, also exist. However, these technologies have either not yet reached the necessary technical level of development or, because of high operating voltages or production costs, are only partially suited for use in portable electronic devices.

Since 1987, displays based on organic light emitting diodes (OLEDs) have become known. They do not have the disadvantages mentioned above. Because of self-emissiveness, the need for back-lighting is eliminated, which substantially reduces space requirements and electric power consumption. The switching times fall within the range of one microsecond and are only slightly temperature-dependent, which makes the use of these displays possible for video applications. The viewing angle is almost 180°. Polarization films such as those required with LC displays are generally not needed, so that greater brightness of the display elements can be achieved. Another advantage is the ability to use flexible and non-planar substrates, as well as simple and cost-effective production.

For OLEDs, two technologies exist which differ in terms of the nature and processing of the organic materials. On the one hand, low molecular weight organic materials, such as hydroxiquinoline-aluminum-III salt ($Alq_3$) can be used, which are generally applied to the appropriate substrate by means of thermal vapor deposition. Displays based on this technology are already commercially available and currently used primarily in automobile electronics. However, because the production of these components is associated with many process steps under a high vacuum, high investment and maintenance costs as well as relatively low rates of throughput make this technology disadvantageous.

For these reasons, an OLED technology has been developed since 1990 that utilizes, as organic materials, polymers that are wet-chemically applied from a solution onto the substrate. The vacuum steps needed to generate the organic layers are eliminated in this technology. Typical polymers are polyaniline, PEDOT (Bayer Co.), poly(p-phenylene-vinylene), poly(2-methoxy-5-(2'-ethyl)-hexyloxy-p-phenylene-vinylene), or polyalkylfluorene, as well as many derivatives thereof.

SUMMARY OF THE INVENTION

According to the invention, the problems cited above are avoided by means of a display according to Claim 1. Advantageous embodiments of the display, as well as its production, are the subject matter of the subclaims.

The invention describes a passive matrix-driven display, in which, in comparison to the state of the art, the window layer used to structure the pixels has been modified so as to permit simple structuring of the second electrode, the cathode, while at the same time allowing for the trouble-free contacting of the cathode by air-resistant and oxygen-resistant connectors. In addition, an encapsulation is applied over the display, which only leaves one end of each cathode connector exposed and otherwise covers the entire window layer and the cathode, thereby creating a display with an increased useful lifetime.

A display according to the invention comprises the following features: first electrode strips running parallel to one another are positioned on a substrate and electrode connectors are disposed perpendicular thereto; an insulating layer is applied, wherein windows are disposed in this layer over the first electrode strips, each of which delimits a functional layer disposed therein; in addition, windows are disposed in the insulating layer which are positioned over the electrode connectors, or areas of the insulating layer are disposed between the electrode connectors; a second, strip-shaped, structured electrode is applied perpendicular to the first electrode strips and contacts the respective functional layer in the windows and the electrode connectors; an encapsulation is provided that covers the insulating layer and one end of each electrode connector.

The invention describes a display, in which, in contrast to the state of the art, the window layer used to structure the pixels has been modified so as to feature extensions between the electrode connectors, or so that windows are disposed in the window layer over the electrode connectors and permit contacting of the electrode connectors by the second electrode (cathode). The additional structured electrode connectors, like the first electrode strips, preferably consist of air-resistant and moisture-resistant ITO. Because these cathode connectors extend outward underneath the encapsulation, the cathode material, which normally consists of sensitive metals, is not exposed to the air, significantly increasing the useful lifetime of a display.

One of the methods that can be used for strip-shaped structuring of the metal cathode (perpendicular to the underlying ITO strips) is the shadow mask technique. In this connection, the metal strips are generated by means of thermal vapor deposition in a vacuum, using a mask with strip-shaped openings. However, because the shadow mask is placed onto the window layer (or is at least placed at a minimal distance from it), a gap of at least the height of one window layer develops over the ITO electrode connectors (see FIG. 4). This gap can result in vapor deposition behind the mask, thereby substantially limiting the minimum distance between the cathode strips. The extensions of the window layer between the electrode connectors or, alternatively, of the windows in the window layer over the electrode connectors substantially prevent or reduce vapor deposition behind the shadow mask.

As an alternative means of strip-shaped structuring of the metal cathode, a display according to the invention comprises the following features: second and third insulating layers are disposed between the windows on the first insulating layer perpendicular to the first electrode strips, and are formed into strip-shaped ridges; the second electrode is disposed between the ridges and, as a result, is structured in the shape of strips.

In this case, during large-surface vapor deposition of the cathode material, the cathode is structured by the metal film being torn off on the edges of the divider ridges, each of which, in the case of a two-layer design, consists of a foot 15 and a cap 20. To ensure an overlap between the metal cathode and the ITO electrode connectors in this case, the window layer is placed, according to the invention, over the ITO electrode connectors and either additional windows in the window layer or openings in the window layer are provided over the ITO connectors, so that the divider ridges are not forced to overcome a step at the edge of the window layer, which could result in instabilities in the divider ridge structure (see FIG. 3). For this reason, the divider ridges in the invention are always constructed on a base of the window layer. However, both versions of the window layer continue to permit contacting of the cathode connectors by the cathode.

The method of producing the displays according to the invention essentially comprises, according to the invention, a new structuring of the window layer following the application of the first electrode strips and the electrode connectors. Following the structuring of the window layer, two different techniques for structuring the metal cathode are used. On the one hand, the metal cathode is vapor deposited through a shadow mask following the application of the functional layers. In the other case, the strip-shaped divider ridges are first produced over the window layer, then the functional polymers are preferably pressed into the windows and, finally, the structured cathodes are produced by means of large-surface vapor deposition and tearing of the metal film on the edges of the divider ridges.

In the following, the invention is explained in greater detail on the basis of a few exemplary embodiments and in connection with the drawings. The figures are only provided to convey a better understanding of the invention and, therefore, are schematically simplified and not to scale.

BRIEF DESCRIPTION OF THE DRAWINGS

FIGS. 8A to 8G show, in cross-section, the structure of a substrate at various stages of the production of a display according to the invention, with a two-layer divider ridge for separating the cathodes.

Like reference numbers and designations in the various drawings indicate like elements.

DETAILED DESCRIPTION

Figure 1:
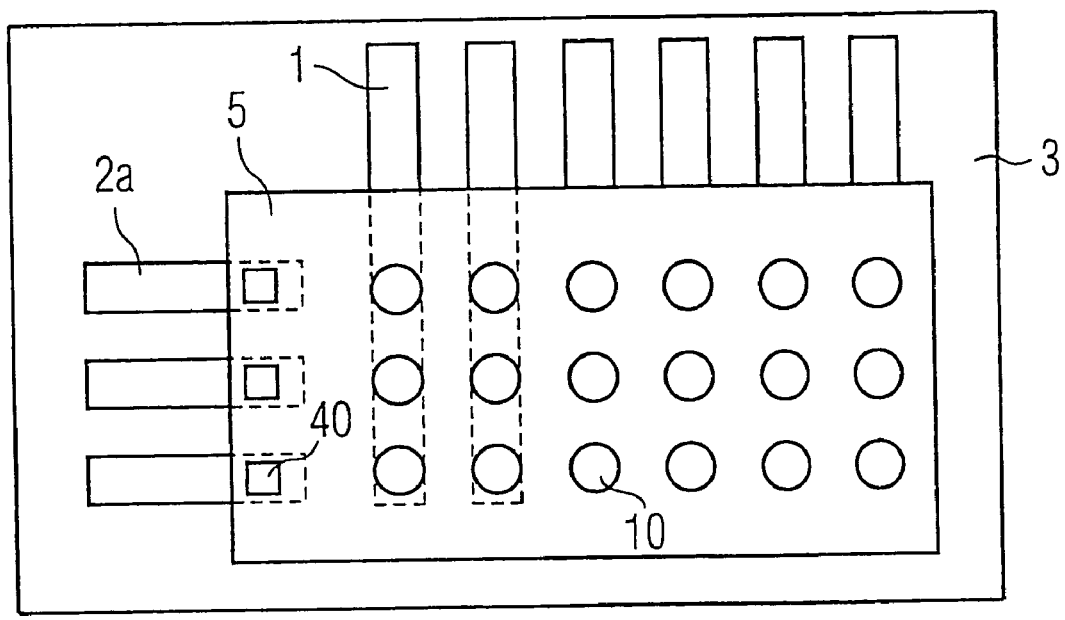
FIG. 1 shows an embodiment, according to the invention, of the window layers over the electrode connector.

The layered structuring of organic light emitting diodes is typically accomplished as follows: The entire surface of a transparent substrate (such as glass) is coated with a transparent electrode (such as indium tin oxide, or ITO). Depending on the application, a photolithographic process is then used to structure the transparent electrode, which later defines the shape of the light emitting pixel.

One or more organic layer comprising electroluminescent polymers, oligomers, low molecular weight compounds (see above), or mixtures thereof are then applied to the substrate with the structured electrode. The application of polymer substances is generally done from the fluid phase by means of doctoring or spin-coating and, more recently, through the use of various printing techniques. Low molecular weight and oligomeric substances are generally deposited from the gas phase by means of vapor deposition or "physical vapor deposition" (PVD). The total layer thickness can range between 10 nm and 10 µm, and is typically between 50 and 200 nm.

A counter-electrode, the cathode, which usually consists of a metal, a metal alloy or a thin insulator layer and a thick metal layer, is then applied to these organic layers. Gas phase deposition by means of thermal vapor deposition, electron beam vapor deposition or sputtering is again used to produce the cathode layers.

A particular challenge in the production of structured displays consists in the need to structure the layer configuration described above so as to create a matrix of individually controlled pixels.

A lithographic technique can be used in the first step of OLED production described above, the structuring of the ITO anode. ITO is extremely sensitive to the typical photoresists and developer fluids, and is easily etched with acids, such as HBr. Structures with a resolution of a few millimeters are easily generated in this fashion.

The structuring of the organic layers and the metal electrode is significantly more difficult. This is attributable to the sensitivity of the organic materials, which would be greatly damaged by the subsequent application of aggressive developer fluid or solvents.

In the case of OLEDs based on vaporizable low molecular weight layers, the individual functional layers can be vapor deposited onto the substrate in structured manner through a shadow mask, so that individual pixels develop. Vapor deposition using a shadow mask technique can also be used to achieve the strip-shaped structuring of the metal cathode (perpendicular to the underlying ITO strips).

The insulating divider ridge technique is an alternative method of structuring the metal cathode. In this process, a lithographic technique is used to apply a row of insulating ridges with sharp tear-off edges onto the substrate, perpendicular to the ITO strips immediately following the structuring of the ITO anode. Following deposition of the organic layers, the metal cathode is vapor deposited onto the entire surface (i.e., without using a shadow mask), at which point the metal film tears off on the sharp edges of the divider ridges. This results in the formation of metal strips (lines) that are isolated from one another and are perpendicular to the underlying ITO anode (columns). If a voltage is applied to a specific ITO anode column and a metal cathode line, the organic emitter layer is illuminated at the point of intersection between the line and the column. The cross-sections of these divider ridges can vary.

In the case of OLEDs based on conjugated polymers, which are applied from the liquid phase, the structuring of the individual pixels is substantially more difficult. Conventional techniques, such as spin-coating or doctoring, uniformly distribute the polymer solution across the entire substrate. Thus, subdivision into areas with small structural widths is quite difficult, except by means of subsequent structuring involving the use of aggressive lithographic methods, which are highly damaging to the polymers. For this reason, in the past a number of printing techniques were already used successfully in the structured application of polymers. A technique that has proven to be especially effective in this regard is inkjet printing, as well as several variants thereof.

Even with these printing techniques, however, it is very difficult to prevent the individual, closely adjacent color areas from running into one another. In the past, this problem was circumvented by using various solution approaches.

In European patent 0 892 028 A2, a method is described in which a layer of an insulating material, into which windows have been embedded at the points at which the pixels are to be positioned later on, is initially applied to the ITO substrate. This insulating material can, for example, be a photoresist that has been modified so that it is not dampened by polymer solutions. Thus, in the case of a color display, the individual drops of the solutions (red, green, blue), after having been applied to the appropriate points, are incorporated without running into one another, and can therefore dry independently of one another and generate the polymer layer.

However, this method does not solve the problem of structuring the cathode strips, which, in the case of passive matrix-driven displays, must be applied to the polymer as the last functional layer. As a result, various technologies for structuring the cathodes of passive matrix displays have been developed in the past. For monochrome displays, a special process was used to develop divider ridges, which are initially applied to the structured ITO substrate. The polymer solutions (generally a transport polymer in a polar solution, followed by an emitter polymer in a non-polar solution) are then applied to these substrates in sequence, by means of spin deposition. As the final layer, the cathode is then vapor deposited onto the entire surface and is torn at the sharp tear-off edges of the divider ridges, thereby forming cathode strips that are isolated from one another. However, this method is only suited for large-surface application of polymer solutions and, therefore, not for full-color displays.

As a further development of the method involving divider ridges for full-color displays, produced using an inkjet printing process, a layer of an insulating material with "windows" (see above) can be additionally applied. In the method described in European patent 0 951 073 A2, the insulating windows and divider ridges are applied to the substrate following the application of individual polymer layers. This, in turn, is associated with the previously-described disadvantages of treatment of the sensitive conjugated polymers with aggressive developer materials, solvents and UV light.

Another problem in the production of the displays results from the fact that the cathode material applied initially generally consists of very sensitive materials, such as calcium or aluminum, which are easily oxidized by air and/or moisture. This leads to a substantial reduction in the useful lifetime of the displays.

To summarize, the particular challenge in the production of passive matrix-driven displays consists in structuring the layer configuration described above in such a way that a matrix of individually controllable pixels is created by means of simultaneous structuring of the functional layers and the cathodes, taking into account the fact that the cathode material is highly sensitive to air and moisture.

FIG. 1 shows a possible embodiment of the window layer 5, wherein round windows are positioned over the first electrode strips 1 and additional windows 40 are provided over the electrode connectors 2a. The course of an electrode connector underneath the window layer is indicated exemplarily by a dashed line.

Figure 2:
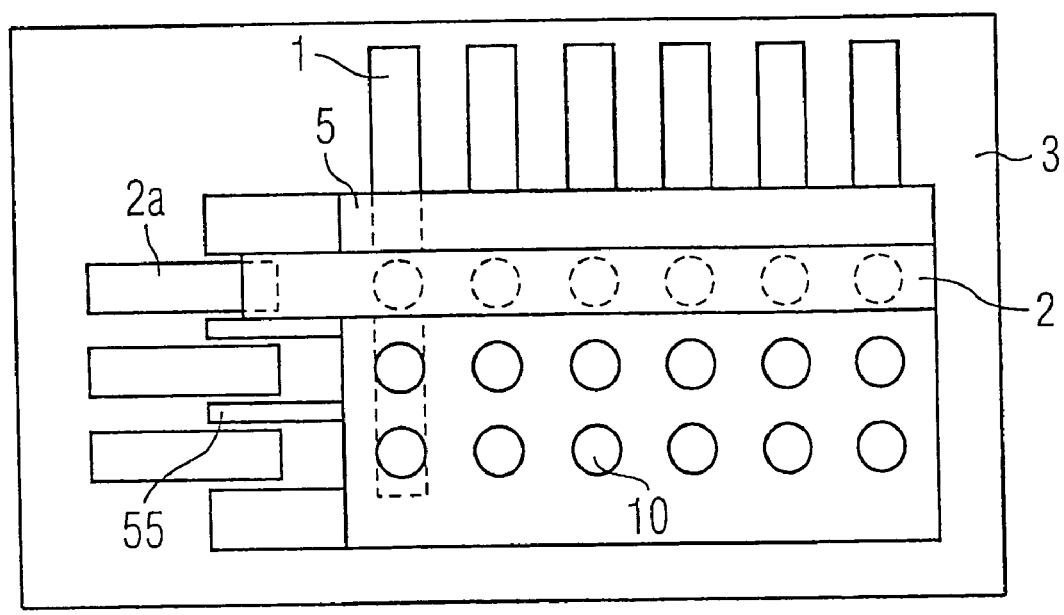
FIG. 2 shows another possible embodiment of the window layer, with extensions between the electrode connectors.

FIG. 2 shows extensions 55 in the window layer 5, which are disposed between the electrode connectors 2a. The course of a second electrode strip, a cathode strip, is shown as an example.

Figure 3:
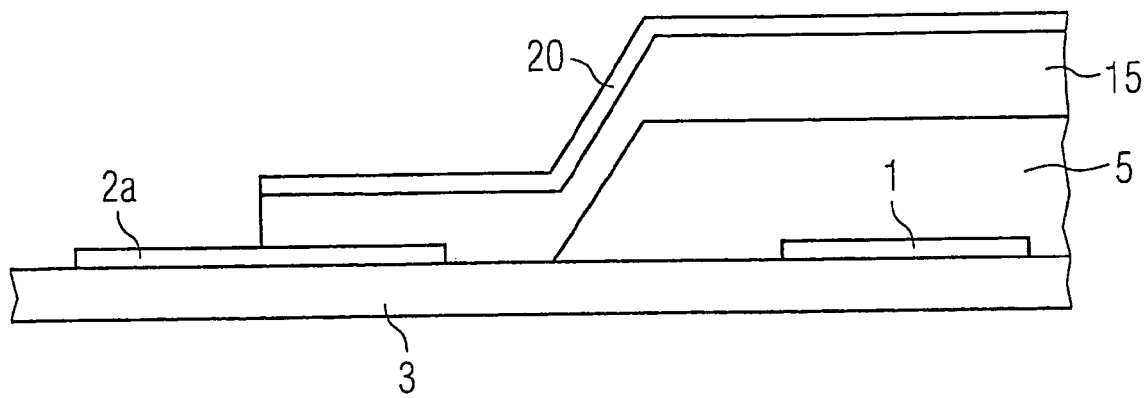
FIG. 3 shows the rising edge that the divider ridges, which are structured in accordance with the state of the art, must overcome when they are passed between the electrode connectors.

FIG. 3 shows the edge that the divider ridges must overcome in a structure of the window layer 5 corresponding to the state of the art. A possible two-layer version of the divider ridge, with a foot 15 and a cap 20, can be seen.

Figure 4:
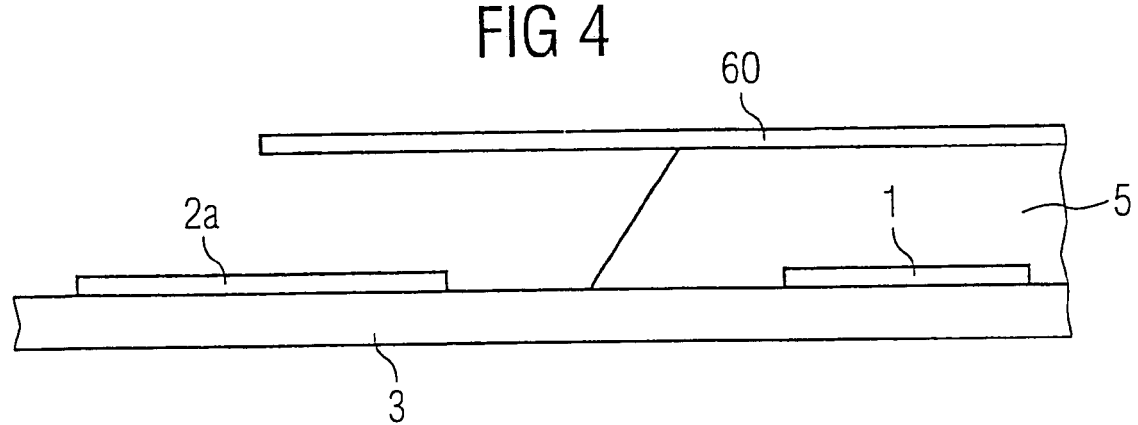
FIG. 4 shows back vapor deposition of a shadow mask during application of the second electrode in the region of the edges of the window layer, in the case of a conventional structuring of the window layer.

FIG. 4 shows the back vapor deposition of a shadow mask during the production of the second electrode (cathode) in the case of a structure of the window layer 5 corresponding to the state of the art. As a result of the back vapor deposition, greater distances must be maintained between the individual cathode strips so as to prevent these strips from overlapping. As a result, the distances between the individual rows of pixels also become greater.

Figure 5:
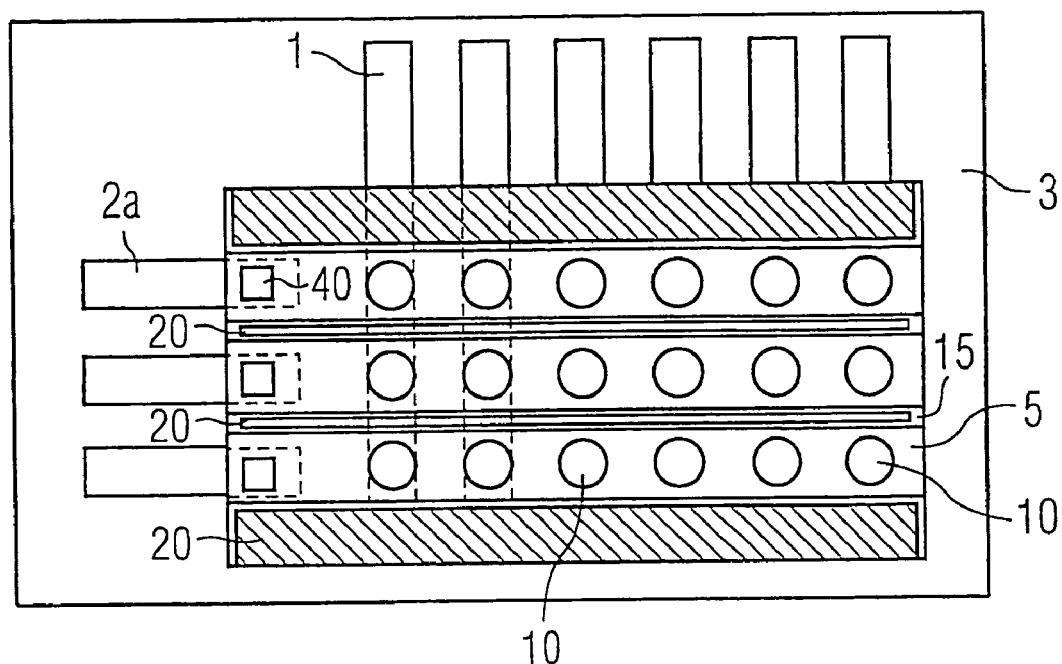
FIG. 5 shows the structure of a display according to the invention, with divider ridges and novel structuring of the window layer with windows.

FIG. 5 shows, in a top view, the structure of a display according to the invention, in the case of a divider ridge structure for separating the cathodes. In this case, the windows 40 are positioned over the electrode connectors and the window layer 5 has been placed over the electrode connectors in such a way that the divider ridges, comprising feet 15 and caps 20, are not forced to overcome a step along the entire length of the cathode.

Figure 6:
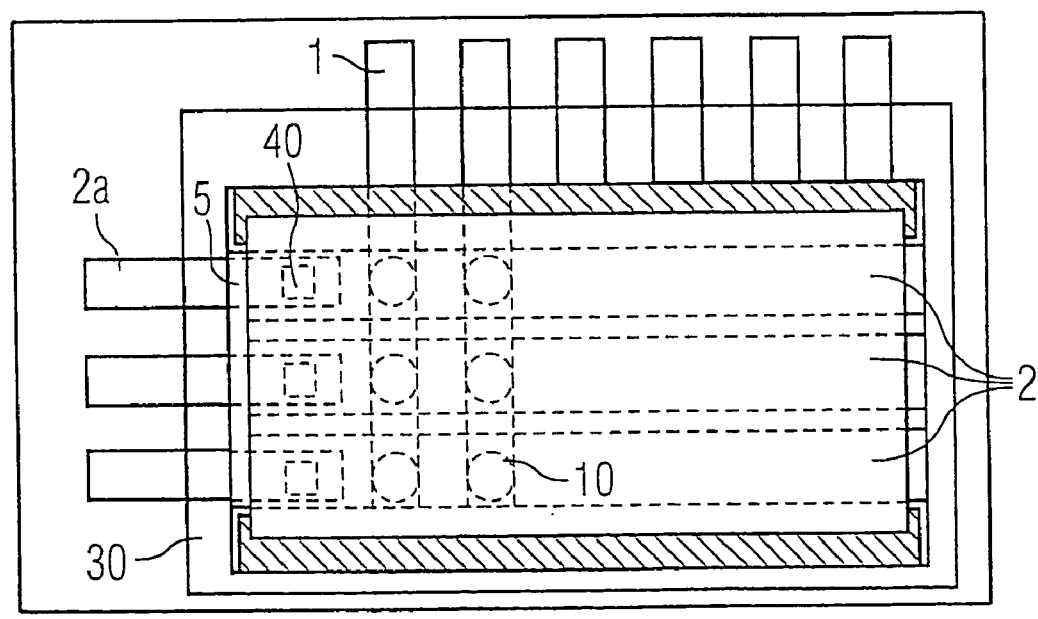
FIG. 6 shows the complete structure of the display with an encapsulation, which leaves one end of each of the air-resistant electrode connectors exposed.

FIG. 6 shows a top view of the complete structure of a display according to the invention. An encapsulation 30 (metal or glass cap) can be seen, which is applied over the structure shown in FIG. 5, wherein the ends of both the first electrode strips 1 and the electrode connectors 2a are left exposed.

Figure 7A:
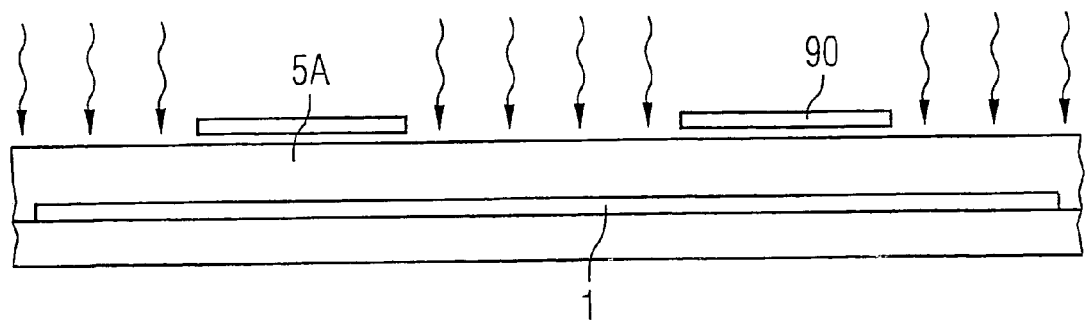
FIGS. 7A to 7E show, in cross-section, the structure of a substrate at various stages of the production of a display according to the invention, with a shadow mask.
Figure 7B:
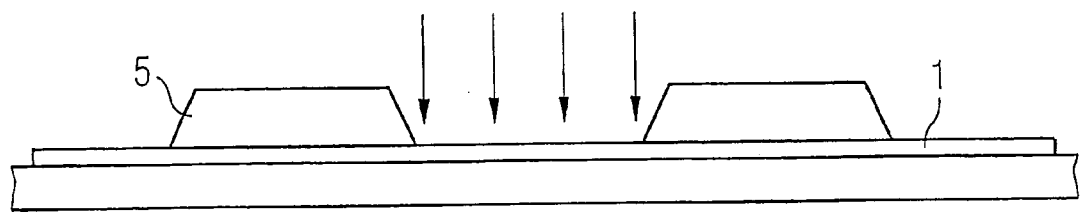
Figure 7C:
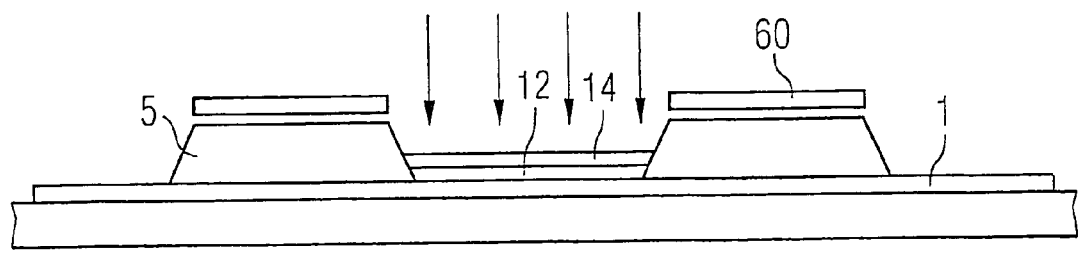
Figure 7D:
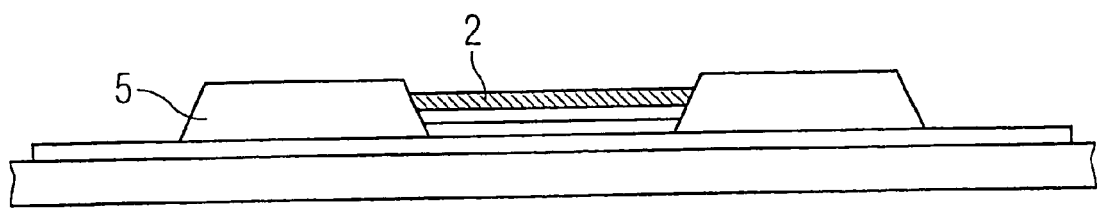
Figure 7E:
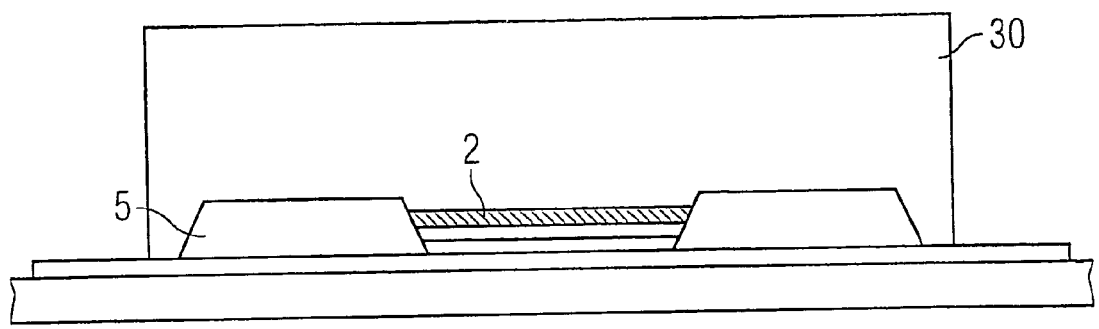

FIG. 7A shows the photolithographic structuring of a layer 5a applied onto the entire surface to produce the window layer 5 through the exposure mask 90. FIG. 7B shows the application of the functional layers in the windows of the window layer 5. According to FIG. 7C, the second electrode, the cathode, is applied onto the perforated transfer polymer 12 and the emitter polymer 14, which were applied in layers on top of one another in the windows 10 of the window layer 5. FIG. 7D shows the complete structure of the display according to the invention, together with the second electrode 2. FIG. 7E shows the subsequent encapsulation 30 over the entire component.

Figure 8A:
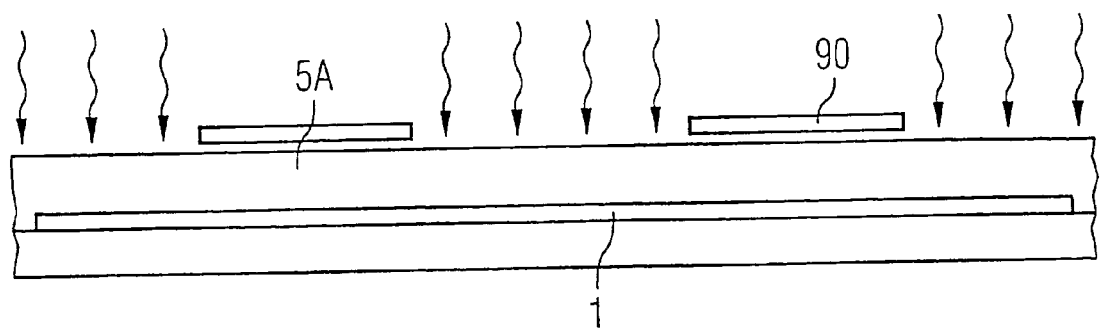

FIGS. 8A to 8G show a variant of the production method mentioned above, in which the second electrode, the metal cathode, is structured by large-surface application of a metal film and by tearing of this film along the edges of a two-layer divider ridge. FIG. 8A shows, in analogy to FIG. 7A, the structuring of the window layer 5 through the shadow mask 90.

Figure 8B:
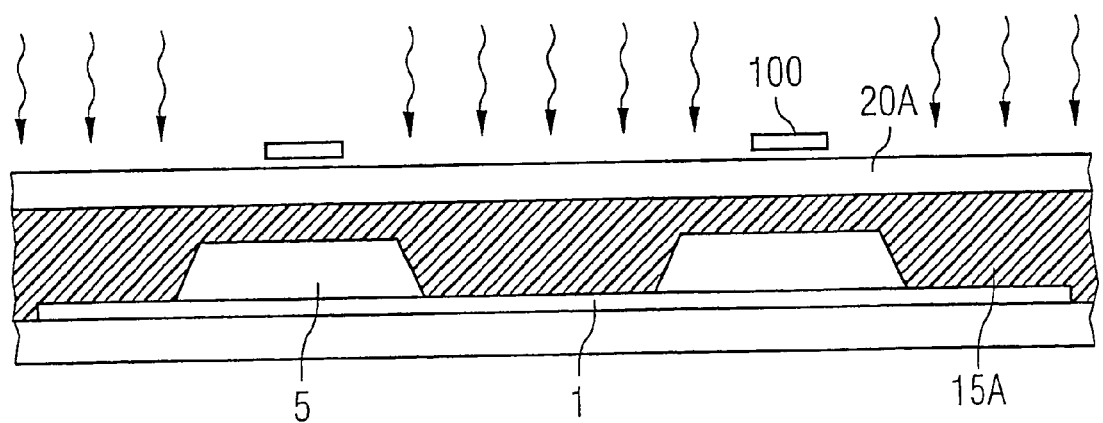

In FIG. 8B, following application of a non-photosensitive layer 15A (such as polyimide) and the third insulating layer 20A (such as a photoresist), the caps 20 of the divider ridges are produced by exposure using a shadow mask 100 and subsequent development.

Figure 8C:
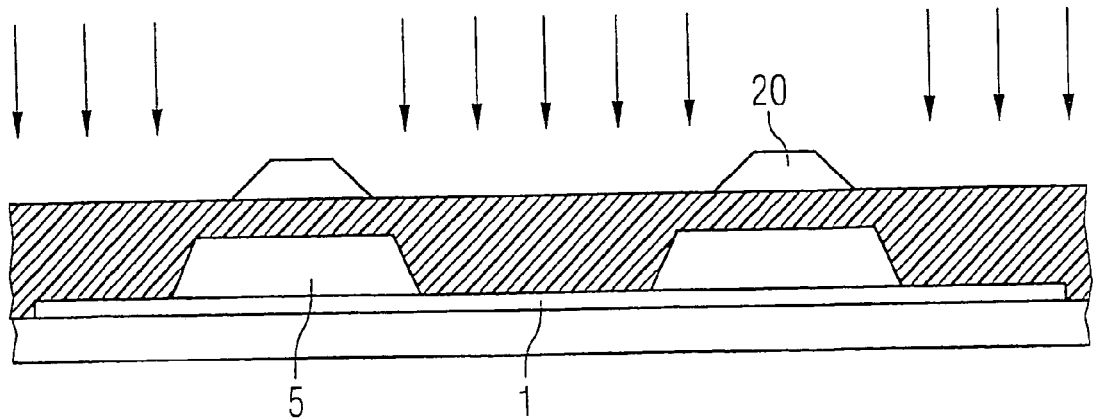

FIG. 8C shows the structuring of the feet 15 of the divider ridges by a solvent acting selectively on the layer 15A. In this connection, the caps of the divider ridges can serve as a mask, wherein suitable selection of the duration of effect of the solvent can also result in under-etching of the caps, so that the feet of the divider ridges are narrower than the caps.

In FIG. 8D, with structuring of the three-layer structure 5, 15, 20 having taken place, the functional polymers are applied into the windows, for example, by inkjet printing. FIG. 8E shows the large-surface vapor deposition of the second electrode 2, wherein it is structured by tearing off the metal film on the edges of the divider ridge during vapor deposition.

FIG. 8F shows, in cross-section, the structure of an embodiment of the display according to the invention following application of the second electrode 2. Strips of a non-functional metal layer 2b, which is formed when the electrode material for the second electrode is applied and torn off on the edges of the divider ridge and which does not electrically contact the functional layers, are positioned on the caps of the divider ridges.

Figure 8G:
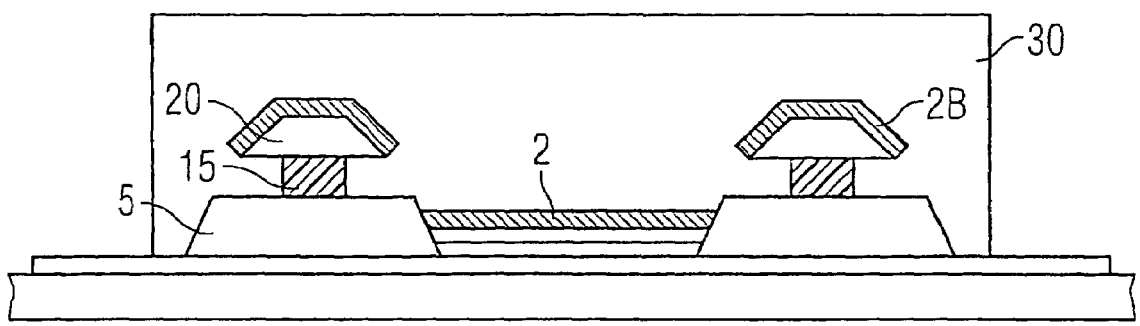

FIG. 8G shows the subsequently applied encapsulation 30, which covers the complete component, with the exception of parts of the electrode connectors 2a and parts of the first electrode strips (also see FIG. 6).

EXAMPLE 1

Production of a Display Using a Shadow Mask for the Second Electrode

1. A glass substrate 3 entirely coated with ITO is structured by a lithographic process corresponding to the state of the art, in combination with an etching process with 30 percent HBr solution, so that the first electrode strips 1 and the electrode connectors 2a are formed.

2. Then a positive photoresist, for example, is spin-deposited onto the substrate and preheated on a heating plate. The spinning parameters are selected so that a layer with a thickness of approx. 6 μm develops. By exposure through a suitable mask and development, window structures 10 are produced over the first electrode strips and, additionally, the photoresist is structured in the region of the electrode connectors so as to form either the extensions 55 between the connectors (see FIG. 2) or the windows 40 over the connectors (see FIG. 1). As an alternative to a photoresist, the material used for the window layer can be any insulating, layer-forming material (such as silicone dioxide), which can be structured using additional resist masks by means of etching, for example.

3. The substrate that has been structured in this manner is subjected to several cleaning steps by means of treatment with solvents and/or plasma activity.

4. Using a micrometering system (such as an inkjet printer), a certain amount of the hole transport polymer solution is initially placed into each window. Following suitable drying, the same system is used to apply and dry the emitter polymer solutions (see FIG. 7B).

5. Then the second electrode is produced by vapor deposition through a shadow mask 60 (see FIG. 7C).

6. Finally, the component is provided with a metal or glass cap 30, for example, and encapsulated with a UV-curing epoxy resin, for example, wherein one end of each electrode connector 2a is left exposed (see FIGS. 7E and 6).

EXAMPLE 2

Production of a Display with Divider Ridges for Separation of the Cathodes:

1. Production of the electrode strips and electrode connectors, as well as of the window layer 5, is analogous to the first two steps in Example 1.

2. Then a layer of a second insulating material, preferably a polyimide, is spin-deposited onto the entire surface of the substrate, followed by brief heating on a heating plate, for example.

3. Then another layer of the first or a different photoresist is spin-deposited onto this polyimide, again onto the entire surface, and is briefly heated on the heating plate. By exposure through a suitable mask 100 and subsequent development with the same developer fluid as described above, this resist is finally formed into a strip-shaped structure, the caps of the divider ridges 20 (see FIG. 8B), wherein the caps between the electrode connectors 2a are formed on the window layer 5 (also see FIG. 5). A subsequent heating step increases the stability of these strips.

4. Through the action of a solvent, which only acts on the polyimide layer, it too is finally structured to form the feet 15 of the divider ridges, so that the divider ridges form the cross-section depicted in FIG. 8D. The use of the same photosensitive resist as in the window layer 5 and the caps of the divider ridges 20 simplifies production, because only two instead of three different materials must be used for the window layer and the ridges.

5. The substrates that have been pre-structured in this manner are subjected to several cleaning steps by means of treatment with solvents and/or plasma activity.

6. Using a micrometering system (such as an inkjet printer), a certain amount of the hole transport polymer solution is first placed into each window. Following suitable drying, the same system is used to apply and dry the emitter polymer solutions (see FIG. 8D).

7. Then a layer of a non-precious metal, such as calcium, following by a layer of a stable, precious metal, such as aluminum or silver, is vapor deposited, so that the second electrode is formed by tearing off the metal film on the edges of the divider ridges (see FIGS. 8E and 8F).

8. Finally, the component is provided with a metal or glass cap 30, for example, and encapsulated with a UV-curing epoxy resin, for example (see FIG. 8G).

The invention claimed is:

1. An organic electroluminescent device, comprising:
a substrate;
a plurality of parallel first electrode strips on the substrate;
electrode connectors disposed perpendicular to the plurality of parallel first electrode strips;
a first insulating layer with first windows positioned over the first electrode strips and second windows positioned over the electrode connectors;
a functional layer disposed in and delimited by the first windows;
a plurality of structured second electrode strips perpendicular to the plurality of parallel first electrode strips and contacting the functional layer in the first windows and the electrode connectors; and
an encapsulation covering the first insulating layer and the plurality of structured second electrode strips, but leaving one end of each of the electrode connectors exposed.

2. The device of claim 1, further comprising:
a second insulating layer and a third insulating layer on the first insulating layer formed as strip-shaped ridges perpendicular to the plurality of parallel first electrode strips, the plurality of structured second electrode strips located between the strip-shaped ridges, the second electrode strips structured by the strip-shaped ridges.

3. The device of claim 2, wherein:
the first insulating layer includes a first material and the third insulating layer includes the first material.

4. The device of claim 2, wherein:
the first and third insulating layers include a photoresist.

5. The device of claim 2, wherein:
the second insulating layer includes a polyimide.

6. The device of claim 1, wherein:
the electrode connectors include indium tin oxide.

7. The device of claim 1, wherein:
the plurality of second electrode strips includes at least one of aluminum and silver.

8. The device of claim 1, wherein:
the encapsulation includes at least one of metal and glass.

9. The device of claim 1, wherein:
the functional layer includes a transfer polymer and an emitter polymer.

10. An organic electroluminescent device, comprising:
a substrate;
a plurality of parallel first electrode strips on the substrate;
electrode connectors disposed perpendicular to the plurality of parallel first electrode strips;
a first insulating layer with windows positioned over the plurality of parallel first electrode strips, the electrode connectors positioned such that an area of the first insulating layer is between at least two of the electrode connectors;
a functional layer disposed in and delimited by the windows;
a plurality of structured second electrode strips perpendicular to the plurality of parallel first electrode strips and contacting the functional layer in the windows and the electrode connectors; and
an encapsulation covering the first insulating layer and the plurality of structured second electrode strips, but leaving one end of each of the electrode connectors exposed.

11. The device of claim 10, further comprising:
a second insulating layer and a third insulating layer on the first insulating layer, formed as strip-shaped ridges perpendicular to the plurality of parallel first electrode strips, the plurality of structured second electrode strips located between the strip-shaped ridges, the second electrode strips structured by the strip-shaped ridges.

12. A method of producing an organic electroluminescent device, comprising:
forming first electrode strips and electrode connectors on a substrate such that the first electrode strips are perpendicular to the electrode connectors;
applying a first insulating layer over the first electrode strips, the first insulating layer having first windows over the first electrode strips and second windows over the electrode connectors;
applying a functional layer in the first windows;
forming second electrodes contacting the functional layer and the electrode connectors; and
encapsulating the first insulating layer and the second electrodes so that an end of each electrode connector is not encapsulated.

13. The method of claim 12, further comprising:
applying a second insulating layer over the first insulating layer;
applying a third insulating layer over the second insulating layer; and
structuring the second and third insulating layers into a strip-shaped ridge perpendicular to the first electrode strips, so that the strip-shaped ridge is between the first windows;
wherein forming the second electrodes includes forming the second electrodes into strip shapes.

14. The method of claim 13, wherein:
the strip shapes of the second electrodes are generated by the strip-shaped ridge.

15. The method of claim 13, wherein:
applying the first insulating layer includes applying a photoresist;
applying the third insulating layer includes applying the photoresist; and
structuring the first and third insulating layers includes exposure through a mask and developing.

16. The method of claim 13, wherein:
applying the second insulating layer includes applying a polyimide;
structuring the third insulating layer occurs prior to structuring the second insulating layer; and
structuring the second insulating layer includes applying a solvent that selectively acts on the second insulating layer and the structured third insulating layer is a mask for structuring the second insulating layer.

17. The method of claim 13, wherein:
forming the second electrodes includes vapor depositing through a mask so that the second electrodes are structured.

18. The method of claim 12, wherein:
applying the functional layer in the first windows includes a drip process.

19. The method of claim 12, wherein:
applying the functional layer in the first windows includes a continuous dispensing process.

20. The method of claim 12, further comprising:
etching the first insulating layer to form the first and second windows.

21. The method of claim 12, wherein:
encapsulating includes encapsulating with a UV-curing epoxy resin.

22. A method of producing an organic electroluminescent device, comprising:

forming first electrode strips and electrode connectors on a substrate, such that the first electrode strips are perpendicular to the electrode connectors;

applying a first insulating layer over the first electrode strips, the first insulating layer having windows over the first electrode strips and areas of the first insulating layer are between at least two of the electrode connectors;

applying a functional layer in the windows such that the functional layer is delimited by the windows;

forming second electrodes contacting the function layer and the electrode connectors; and encapsulating the first insulating layer and the second electrodes so that an end of each electrode connector is not encapsulated.

* * * * *

UNITED STATES PATENT AND TRADEMARK OFFICE
CERTIFICATE OF CORRECTION

| | |
|---|---|
| PATENT NO. | : 7,375,461 B2 |
| APPLICATION NO. | : 10/483144 |
| DATED | : May 20, 2008 |
| INVENTOR(S) | : Jan Birnstock et al. |

It is certified that error appears in the above-identified patent and that said Letters Patent is hereby corrected as shown below:

On the Title Page, Page 2, Foreign Patent Documents, Column 2, replace "200294371" with --2000294371--.

Signed and Sealed this

Second Day of September, 2008

JON W. DUDAS
*Director of the United States Patent and Trademark Office*